July 19, 1966 C. P. JOHNSON 3,261,988

HIGH SPEED SIGNAL TRANSLATOR

Filed Dec. 23, 1963

INVENTOR.
CHARLES P. JOHNSON

BY A. M. Fernandez

ATTORNEY

United States Patent Office 3,261,988
Patented July 19, 1966

3,261,988
HIGH SPEED SIGNAL TRANSLATOR
Charles P. Johnson, Long Beach, Calif., assignor to North American Aviation, Inc.
Filed Dec. 23, 1963, Ser. No. 332,740
3 Claims. (Cl. 307—88.5)

This invention relates to a high-speed, low-power signal translator. In digital systems such as data processing or control systems, high-speed line receivers are often required to couple input lines to logic networks, particularly where step or pulse type signals are being transmitted over unshielded lines to the logic network.

In many applications, low-power dissipation is desirable, and in still others size or weight is an important factor. Accordingly, an object of this invention is to provide a high-speed, low-power signal translator of such a configuration that it may be readily fabricated as an integrated semiconductor circuit.

In the past a differential amplifier and emitter-follower arrangement has been employed as a signal translator for coupling an input line to a logic circuit. The differential amplifier functions as a level detector in order to distinguish a step or pulse signal from a line disturbance.

An emitter follower driven by a differential amplifier is capable of being switched at high speeds; however, the output terminal of the emitter follower is not capable of changing voltage levels at comparable high speeds due to the high RC time constant for the load capacitance to be charged, or discharged, while the emitter-follower is cut off. Accordingly, another object of this invention is to provide a differential amplifier and emitter-follower arrangement having a low RC time constant for load capacitance.

Still another object of the invention is to provide a low RC time constant for charging, or discharging, a capacitive load at high speeds with low power dissipation.

Other objects and advantages will become apparent from the following description in connection with the accompanying drawings in which.

Figure 1:
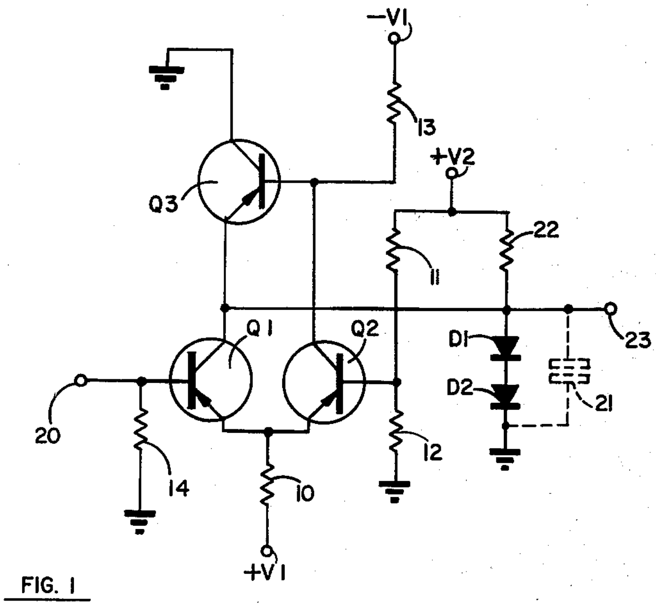
FIG. 1 is a circuit diagram of an embodiment of the invention.

Referring now to FIG. 1, a differential amplifier comprising transistors Q1 and Q2 having a common emitter bias resistor 10 is connected to an output emitter-follower Q3. The emitter of the transistor Q3 is connected to the collector of the transistor Q1 in accordance with the present invention such that it clamps the collector of the transistor Q1 substantially to ground while both are conducting.

The transistor Q2 is biased by a voltage dividing network comprising resistors 11 and 12 to be non-conducting in the absence of an input pulse. With the transistor Q2 off, the transistor Q3 is biased on through a resistor 13 and the transistor Q1 is biased on through a resistor 14. Thus, in the absence of an input pulse at an input terminal 20, load capacitance 21 is substantially discharged due to the low impedance discharge path through the conducting transistor Q3. The output terminal 23 is then virtually at ground potential.

Figure 2:
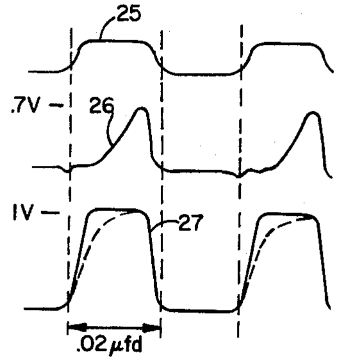
FIG. 2 is a waveform diagram illustrating the performance of the invention as compared with a prior-art arrangement.

When a positive pulse such as a pulse 25 in the waveform diagram of FIG. 2 is received, the transistor Q1 is cut off when the potential at the input terminal 20 exceeds the reference voltage at the base of the transistor Q2. Owing to the common emitter resistor 10, when the transistor Q1 is cut off, the transistor Q2 is turned on and the emitter-follower Q3 having its base electrode connected to the collector of the transistor Q2 is also cut off.

In that manner, the load capacitance 21 connected to the output terminal 23 is charged to a positive potential through a resistor 22.

If the only charge path provided is through the resistor 22, as in prior-art arrangements, the leading edge of the output pulse would lag as shown by a pulse 26 in FIG. 2 owing to the high RC time constant required for exponentially charging the load capacitance 21 through the resistor 22.

The value of the resistor 22 could be decreased in order to decrease the RC time constant for charging the load capacitance but an increase in power dissipation would be incurred during both switching states due to the increased current through resistor 22. The increased current would flow through the transistor Q3 or through clamping diodes D1 and D2, depending on the input signal level. In other words, in order to keep the power dissipation at a minimum, the resistor 22 is made as large as possible while maintaining the diodes D1 and D2 forward-biased when the emitter-follower Q3 is cut off, or when Q3 is conducting.

In order to decrease the RC time constant for the charge path of the load capacitance 21, without decreasing the resistor 22 and increasing the power dissipated, thereby increasing the speed of operation of the emitter-follower output, the collector of the transistor Q1 is connected to the emitter of the emitter-follower Q3 in accordance with the present invention, instead of to ground as in the prior art. In that manner, current through the transistor Q1 during its transition period from conduction to cut-off is diverted from the transistor Q3 which is also being cut off to the output terminal 23, thereby aiding in the charging of the load capacitance. The result is that the rise time of the output pulse is greatly improved to the form of a pulse 27 in FIG. 2.

The pulses 26 and 27 of FIG. 2 were derived for a comparison from identically the same circuits without a load connected to the output terminal 23 so that the load capacitance 21 is a minimum. The only difference between the two circuits is that the circuit from which the pulse 26 was derived did not have the collector of its transistor Q1 connected to the emitter of the emitter-follower Q3; instead, the collector of the transistor Q1 was connected to ground. Both pulses 26 and 27 are drawn to the same scale so that it may be seen that the pulse 26 reached a maximum of only approximately .7 volt, whereas the pulse 27 reached the peak amplitude of one volt established by the clamping diodes D1 and D2. With an output load of 100 $\mu\mu$farad connected to the output terminal 23, the rise time of the output pulse 27 degenerated to that shown by the dotted line but still provided a peak amplitude of one volt and a suitable pulse width of .02 microsecond.

The values of the resistors controlling the operation of the circuit from which the pulse 27 was derived are as follows:

| | |
|---|---|
| Resistor **10** | 8.5K |
| Resistor **11** | 1.2K |
| Resistor **12** | 3.3K |
| Resistor **13** | 12K |
| Resistor **14** | 20K |
| Resistor **22** | 1.2K |

The voltages applied to such an illustrative embodiment of the invention were $+V1=12$ volts; $-V1=-6$ volts; and $+V2=4.5$ volts. Such a circuit is capable of switching at 5 megacycle rates with a total circuit power dissipation of approximately 25 milliwatts. Switching rates of 10 megacycles may be readily achieved with only a slight increase in power dissipation by a slight decrease in the value of the resistor 22 or the resistor 10 or both the resistor 22 and the resistor 10.

Thus, from the waveforms of FIG. 2 it may be seen that the use-time of the loading, or positive going, edge of the pulse being translated is improved over the prior art. The trailing, or negative going, edge is also improved in that it does not tend to reach zero volts quite as early. In the prior art arrangement, the emitter-follower is actually being operated as a class-A amplifier and, owing to the gain (approximately 100) of the differential amplifier, the slightest drop in the input signal is exaggerated in the output signal. In the present invention, the emitter-follower is not operated as a class-A amplifier but as a switch driven to cutoff when the transistor Q2 is turned on and the transistor Q1 is turned off. While cut off, the transistor Q3 is actually reverse biased by approximately one volt, thereby rendering the output signal less sensitive to the initial drop in the input signal. This is an important advantage as it not only prevents a narrowing of the output signal but also renders the output signal of the arrangement less sensitive to noise.

While the principles of the invention have now been made clear in an illustrative embodiment, there will be immediately obvious to those skilled in the art many modifications in structure, proportions and elements used in the practice of the invention, and otherwise, which are particularly adapted for specific environments and operating requirements, without departing from those principles. The appended claims are therefore intended to cover and embrace any such modifications within the limits only of the true spirit and scope of the invention.

I claim:

1. A circuit for translating pulses from an input terminal to an output terminal adapted to be connected to a capacitive load comprising a switching amplifier having its control electrode connected to said input terminal, and its collector connected to said output terminal, a follower-type amplifier having its emitter connected to said output terminal and its collector to a source of reference potential, and means coupled to said switching amplifier for translating an output signal therefrom to the base of said follower-type amplifier to switch said follower-type amplifier from conduction to non-conduction substantially in phase with said switching transistor, whereby said capacitive load discharges through said follower-type amplifier while it is switched on and charges partially through said switching amplifier while it is being switched off.

2. In combination, a differential amplifier comprising first and second valves including means for causing one of said valves to conduct while the other is non-conducting, a follower-type amplifier comprising a third valve having its emitter-collector circuit in series with the emitter-collector circuit of said first valve, and having its control electrode connected to the collector of said second valve, said amplifier including means causing it to become conductive when said first valve is conductive and non-conductive when said first valve is non-conductive, and an output terminal connected to the emitter of said third valve.

3. In combination, first and second transistors having a common emitter bias resistor connected to a source of bias potential of a given polarity, a third transistor having its emitter and collector connected in series between a source of reference potential and the collector of said first transistor, and having its base connected to the collector of said second transistor, said transistor being conductive when said first transistor is conductive and non-conductive when said first transistor is non-conductive, a resistor connecting the collector of said second transistor to a source of bias potential opposite said given polarity, a resistor connecting the emitter of said third resistor to a source of bias potential of said given polarity, means for biasing the base of one of said first and second transistors to a selected threshold level, means for coupling a signal source to the base of the other of said first and second transistors, and means for coupling a load circuit to the emitter of said third transistor.

References Cited by the Examiner

UNITED STATES PATENTS

| | | | |
|---|---|---|---|
| 3,171,984 | 3/1965 | Eshelman et al. | 307—88.5 |
| 3,173,098 | 3/1965 | Peretz | 330—69 X |
| 3,194,979 | 7/1965 | Toy | 307—88.5 |

ARTHUR GAUSS, *Primary Examiner.*

D. D. FORRER, *Assistant Examiner.*